United States Patent [19]

Wilhoit

[11] Patent Number: 5,395,781
[45] Date of Patent: Mar. 7, 1995

[54] METHOD OF MAKING A SEMICONDUCTOR DEVICE USING PHOTORESIST FLOW

[75] Inventor: Michael S. Wilhoit, Boise, Id.

[73] Assignee: Micron Technology, Inc., Boise, Id.

[21] Appl. No.: 197,893

[22] Filed: Feb. 16, 1994

[51] Int. Cl.$^6$ ............... H01L 21/265; H01L 21/312; H01L 21/475
[52] U.S. Cl. ................... 437/44; 437/229; 437/909; 156/659.1; 257/327
[58] Field of Search ............ 437/41, 44, 909, 229; 156/659.1; 257/327

[56] References Cited

U.S. PATENT DOCUMENTS

| 4,755,479 | 7/1988 | Miura | 437/44 |
| 5,175,122 | 12/1992 | Wang et al. | 437/67 |
| 5,234,852 | 8/1993 | Liou | 437/44 |

FOREIGN PATENT DOCUMENTS

| 164214A | 3/1989 | Japan | 437/44 |
| 2266531A | 10/1990 | Japan | 437/44 |
| 4142747A | 5/1992 | Japan | 437/44 |

*Primary Examiner*—Olik Chaudhuri
*Assistant Examiner*—Richard A. Booth
*Attorney, Agent, or Firm*—Kevin D. Martin

[57] ABSTRACT

A process used during the formation of a semiconductor device comprises the formation of a stack having a substrate, a layer of oxide, a polycrystalline silicon layer, and a photoresist mask. An etch is performed to pattern the polycrystalline silicon layer, then the photoresist is flowed to cover the edges of the polycrystalline silicon. Finally, a doping step is performed using the flowed photoresist as a doping barrier, thus allowing for a distance between the poly and an implanted region in the substrate.

18 Claims, 2 Drawing Sheets

METHOD OF MAKING A SEMICONDUCTOR DEVICE USING PHOTORESIST FLOW

FIELD OF THE INVENTION

This invention relates to the field of semiconductor manufacture, and more particularly to a process for forming a doping barrier.

BACKGROUND OF THE INVENTION

During the formation of a semiconductor device such as dynamic and static random access memories, erasable programmable read-only memories, and microprocessors, it is often necessary to form spacers 10, for example at the edges of a polycrystalline silicon (poly) transistor gate 12 as shown in FIG. 1. The spacer allows a subsequently formed implanted region 14 into an underlying substrate 16, for example with an N-type material, to be set away from the gate by a distance 18 approximately equal to the width of the spacer at the substrate. This distance 18 between the implanted area 14 and the gate 12 produces a more electrically desirable cell. FIG. 1 also shows an insulation layer 20 between the poly gate 12 and the substrate 16.

To form the spacer, a blanket layer of material such as oxide is formed over the gate, and a vertical etch is performed for a period of time. The etchant contacts the spacer material less at those points which have a more vertical profile, and as such leave the spacer material as shown in FIG. 1.

Another method of allowing for a distance between the implanted area and the gate is shown in FIG. 2. A patterned photoresist layer is formed over a blanket layer of poly, and an anisotropic (vertical) etch is performed on the poly layer. Next, an isotropic etch selective to poly is performed which causes the poly 30 to recede under the photoresist 32. A vertical dopant implant is performed as shown in FIG. 2 using the photoresist 32 as a mask. The photoresist is removed, thus leaving a structure similar to that of FIG. 1 without the spacers.

SUMMARY OF THE INVENTION

A process used during the formation of a semiconductor device comprises a first step of forming an insulation layer over a substrate, then forming a conductive layer over the insulation layer. A photoresist layer is then formed over the conductive layer, and the conductive layer is patterned. The photoresist layer is flowed to form spacers from the photoresist layer. Finally, the substrate is doped using the photoresist layer as a spacer.

Objects and advantages will become apparent to those skilled in the art from the following detailed description read in conjunction with the appended claims and the drawings attached hereto.

It should be emphasized that the drawings herein are not necessarily to scale but are merely schematic representations and may not portray the specific parameters or the structural details of the invention, which can be determined by one of skill in the art by examination of the information herein.

DETAILED DESCRIPTION OF THE INVENTION

Figure 3:
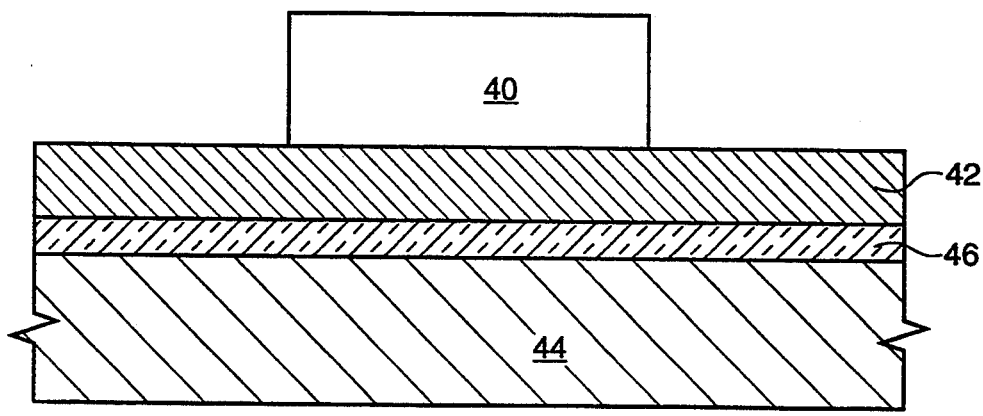
FIG. 3 shows a starting structure for one embodiment of the invention.
Figure 4:
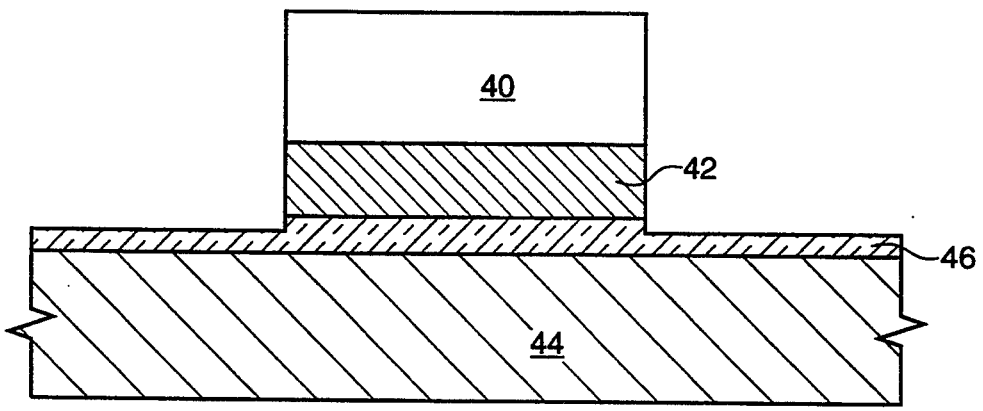
FIG. 4 shows the FIG. 3 structure after an etch.

In accordance with the invention, a starting structure of FIG. 3 was formed according to means known in the art. The structure included a patterned photoresist layer 40, which was about 11,000 Å (11K Å) thick, over a blanket poly layer 42 which was about 5K Å thick. The poly layer 42 was separated from a substrate 44 by an insulator 46. In the instant case silicon dioxide was used as an insulator, but numerous other insulators, typically oxides, would function adequately. The structure of FIG. 3 was then etched to pattern the poly layer 42. A portion of the insulator 46 may also be etched, and the structure of FIG. 4 resulted.

Figure 5:
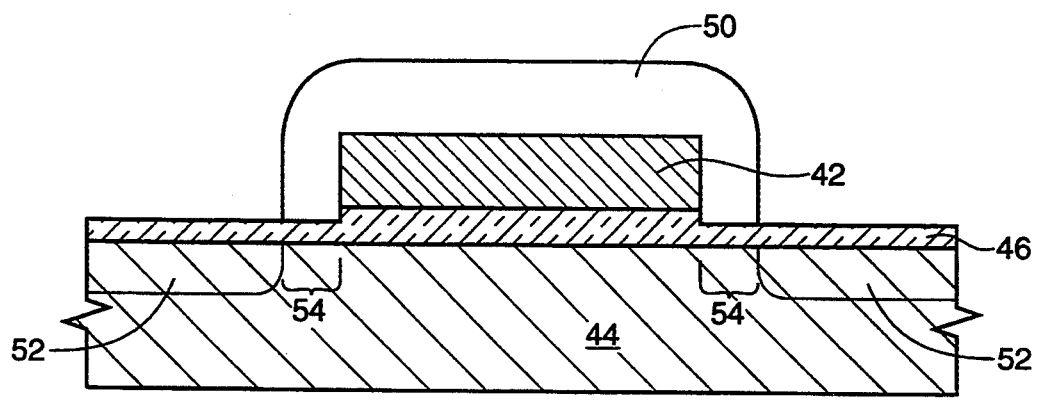
FIG. 5 shows the FIG. 4 structure after a reflow of photoresist.

Next, as shown in FIG. 5, the photoresist 50 was flowed which caused it to cover edges of the poly structure 42 and a portion of the exposed insulation layer 46. The photoresist layer functioned as a spacer during a subsequent implant which formed the structure having implanted regions 52 as shown in FIG. 5. The photoresist layer 50 prevented doping of the substrate 44 underneath the spacer thereby forming an offset 54 between the poly structure 42 and the doped substrate 52 as shown, and producing a cell with desirable electrical properties.

Figure 1:
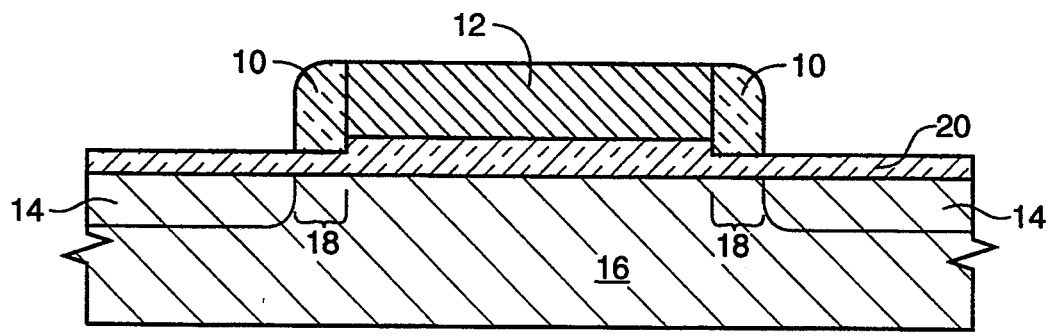
FIG. 1 shows a structure having spacers to allow for an offset between a poly gate and a dopant implant.
Figure 2:
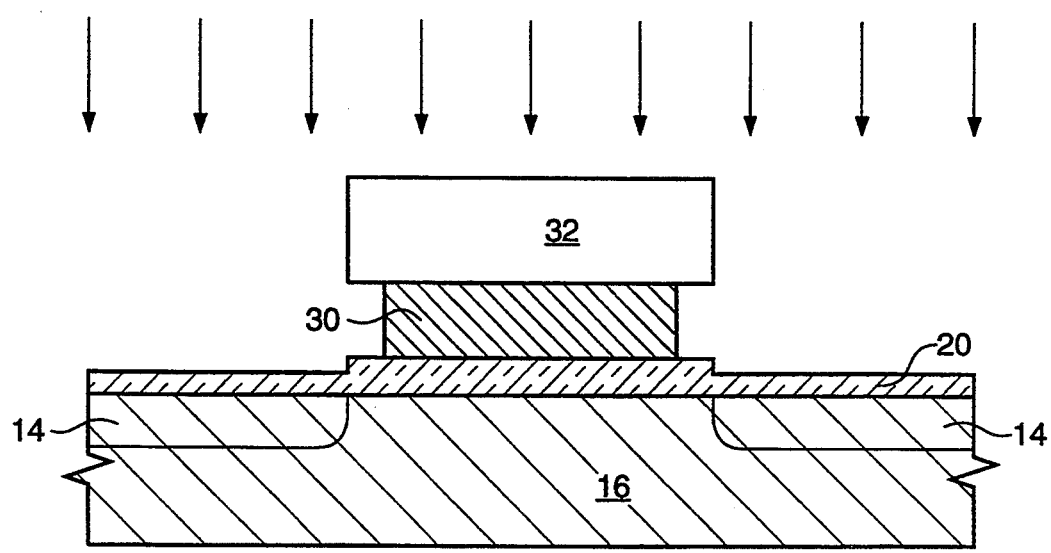
FIG. 2 shows a structure having an etched poly gate with a photoresist overhang which allows for an offset between a poly gate and a dopant implant.

The flow step was performed with a model 5000E reactive ion etch chamber, manufactured by Applied Materials, Inc. of Santa Clara, Calif. Setpoints for the etcher included a pressure of 400 millitorr (mt), a wattage radio frequency (RF) of 600 watts (W), a process gas of nitrogen at 50 standard cubic centimeters (SCCM), and no magnetic field was established. The duration of the etch was about 200 seconds. Conceivably, other parameters may also function adequately depending on the thickness and composition of the photoresist. For example, a pressure range of ten mt to two. Torr, a wattage RF of one W to 1000 W, any nobel gas having a flow rate of from 1 SCCM to 500 SCCM, a magnetic field of from 0 gauss to 300 gauss, for a duration of from one second to 600 seconds would produce sufficient results, depending on the photoresist used and its thickness. A vertical etch can performed for a period of time on the structure of FIG. 5, which will contact the spacer material less at those points which have a more vertical profile, and as such leave the spacer material similar to that as shown in FIG. 1.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the photoresist layer which is flowed can be formed over layers other than polycrystalline silicon, and various etcher settings would be sufficient, depending on the thickness and composition of the resist and the insulator. It is therefore contemplated that the appended claims will cover any such modifications or embodiments as fall within the true scope of the invention.

What is claimed is:

1. A process used during the formation of a semiconductor device, comprising the following steps:
   a) forming an insulation layer over a substrate;
   b) forming a conductive layer over said insulation layer;
   c) forming a patterned photoresist layer over said conductive layer;
   d) patterning said conductive layer using said photoresist layer as a mask and forming an edge from said conductive layer;
   e) flowing said photoresist layer to form a photoresist spacer to cover said edge of said conductive layer; and
   f) doping said substrate using said photoresist layer as a spacer.

2. The process of claim 1 wherein said conductive layer is polycrystalline silicon and forms a transistor gate, and said spacer prevents a doping material from doping said substrate underneath said spacer thereby forming an offset between said transistor gate and said doped substrate.

3. The process of claim 1 wherein said flowing step is performed in a reactive ion etch chamber of a reactive ion etcher, said etcher having the following setpoints:
   a) a pressure range of ten millitorr to two Torr;
   b) a wattage radio frequency of between one watt and 1000 watts;
   c) a noble gas flow rate of from one standard cubic centimeter to 500 standard cubic centimeters;
   d) a magnetic field of from zero gauss to 300 gauss; and
   e) a duration of from one second to 600 seconds.

4. The process of claim 1 wherein said flowing step is performed in a reactive ion etch chamber of a reactive ion etcher, said etcher having the following setpoints:
   a) a pressure of 400 millitorr;
   b) a wattage radio frequency of 600 watts;
   c) a nitrogen gas flow rate of 50 standard cubic centimeters;
   d) a magnetic field of zero gauss; and
   e) a duration of 200 seconds.

5. The process of claim 1, wherein step c) forms a photoresist layer having a thickness of about 11,000 angstroms.

6. The process of claim 1, wherein step c) forms a photoresist layer having a thickness of about 11,000 angstroms and said conductive layer has a thickness of about 5,000 angstroms.

7. A process for forming a spacer at the edges of a transistor gate during the formation of a semiconductor device, comprising the following steps:
   a) forming a polycrystalline silicon layer over a semiconductor substrate;
   b) forming a photoresist layer over said polycrystalline silicon layer;
   c) etching said polycrystalline silicon layer using said photoresist layer as a mask and forming a pair of edges from said polycrystalline silicon layer;
   d) flowing said photoresist layer over said edges to form spacers from said photoresist layer,
wherein said polycrystalline silicon layer forms a transistor gate.

8. The process of claim 7 wherein said spacer prevents a doping material from doping said substrate underneath said spacer thereby forming an offset between said gate and said doped substrate.

9. The process of claim 7 wherein said flowing step is performed in a reactive ion etch chamber of a reactive ion etcher, said etcher having the following setpoints:
   a) a pressure range of ten millitorr to two Torr;
   b) a wattage radio frequency of between one watt and 1000 watts;
   c) a noble gas flow rate of from one standard cubic centimeter to 500 standard cubic centimeters;
   d) a magnetic field of from zero gauss to 300 gauss; and
   e) a duration of from one second to 600 seconds.

10. The process of claim 7 wherein said flowing step is performed in a reactive ion etch chamber of a reactive ion etcher, said etcher having the following setpoints:
    a) a pressure of 400 millitorr;
    b) a wattage radio frequency of 600 watts;
    c) a nitrogen gas flow rate of 50 standard cubic centimeters;
    d) a magnetic field of zero gauss; and
    e) a duration of 200 seconds.

11. The process of claim 7, wherein step b) forms a photoresist layer having a thickness of about 11,000 angstroms.

12. The process of claim 7, wherein step b) forms a photoresist layer having a thickness of about 11,000 angstroms and said transistor gate has a thickness of about 5,000 angstroms.

13. A process for forming a spacer at the edge of a conductive structure during the formation of a semiconductor device, comprising the following steps:
    a) forming a conductive layer having a flat surface;
    b) forming a photoresist layer over said conductive layer;
    c) etching said conductive layer using said photoresist layer as a mask and forming an edge from said conductive layer;
    d) flowing said photoresist layer over said edge to form a spacer from said photoresist layer.

14. The process of claim 13 wherein said conductive layer is polycrystalline silicon and said spacer prevents a doping material from doping said substrate underneath said spacer thereby forming an offset between said etched conductive layer and said doped substrate.

15. The process of claim 13 wherein said flowing step is performed in a reactive ion etch chamber of a reactive ion etcher, said etcher having the following setpoints:
    a) a pressure range of ten millitorr to two Torr;
    b) a wattage radio frequency of between one watt and 1000 watts;
    c) a noble gas flow rate of from one standard cubic centimeter to 500 standard cubic centimeters;
    d) a magnetic field of from zero gauss to 300 gauss; and
    e) a duration of from one second to 600 seconds.

16. The process of claim 13 wherein said flowing step is performed in a reactive ion etch chamber of a reactive ion etcher, said etcher having the following setpoints:
    a) a pressure of 400 millitorr;
    b) a wattage radio frequency of 600 watts;
    c) a nitrogen gas flow rate of 50 standard cubic centimeters;
    d) a magnetic field of zero gauss; and
    e) a duration of 200 seconds.

17. The process of claim 13, wherein step b) forms a photoresist layer having a thickness of about 11,000 angstroms.

18. The process of claim 13, wherein step b) forms a photoresist layer having a thickness of about 11,000 angstroms and said transistor gate has a thickness of about 5,000 angstroms.

* * * * *